United States Patent
Kuo et al.

(10) Patent No.: US 8,866,004 B1
(45) Date of Patent: Oct. 21, 2014

(54) FRAME INTERCONNECT FOR CONCENTRATED PHOTOVOLTAIC MODULE

(75) Inventors: Bob Shih-Wei Kuo, Chandler, AZ (US); SungSun Park, Gwangjin-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 1156 days.

(21) Appl. No.: 12/481,512

(22) Filed: Jun. 9, 2009

(51) Int. Cl.
*H01L 31/00* (2006.01)
*H01L 31/042* (2014.01)

(52) U.S. Cl.
USPC ............................ 136/256; 136/259; 136/244

(58) Field of Classification Search
CPC ... H01L 24/80; H01L 31/048; H01L 31/0522; Y02E 10/52
USPC ........................... 136/244, 246, 251, 256, 259
See application file for complete search history.

(56) References Cited

U.S. PATENT DOCUMENTS

| | | | |
|---|---|---|---|
| 4,257,823 A | 3/1981 | Bevilacqua | |
| 4,936,783 A * | 6/1990 | Petersen | 439/70 |
| 5,460,659 A * | 10/1995 | Krut | 136/246 |
| 5,622,873 A | 4/1997 | Kim et al. | |
| 6,005,287 A | 12/1999 | Kaiya et al. | |
| 6,013,935 A | 1/2000 | Shie | |
| 6,040,626 A | 3/2000 | Cheah et al. | |
| 6,576,986 B2 | 6/2003 | Kobayakawa | |
| 6,650,004 B1 | 11/2003 | Horie | |
| 6,756,658 B1 | 6/2004 | Gillett | |
| 6,794,740 B1 | 9/2004 | Edwards et al. | |
| 6,809,413 B1 * | 10/2004 | Peterson et al. | 257/680 |
| 6,815,244 B2 | 11/2004 | Bottner et al. | |
| 6,844,615 B1 | 1/2005 | Edwards et al. | |
| 6,897,567 B2 | 5/2005 | Horie | |
| 7,001,799 B1 | 2/2006 | Edwards et al. | |
| 7,002,241 B1 | 2/2006 | Mostafazadeh et al. | |
| 7,193,298 B2 | 3/2007 | Hong et al. | |
| 7,977,777 B2 * | 7/2011 | Federici et al. | 257/675 |
| 2005/0161777 A1 | 7/2005 | Horie | |
| 2006/0006506 A1 | 1/2006 | Watanabe et al. | |
| 2008/0149161 A1 * | 6/2008 | Nishida et al. | 136/244 |

* cited by examiner

*Primary Examiner* — Tamir Ayad
(74) *Attorney, Agent, or Firm* — Kevin B. Jackson

(57) ABSTRACT

In accordance with the present invention, there is provided multiple embodiments of a concentrated photovoltaic (CPV) receiver package or module which includes a uniquely configured frame interconnect to facilitate the electrical connection of a receiver die of the CPV module to the conductive pattern of an underlying substrate thereof. In each embodiment of the present invention, a single piece of sheet metal is bent to form features to fit over the bus bar on the receiver die and bond pads of the conductive pattern on the substrate. Electrical connections can be made by soldering or conductive paste attach. Elevated, flat areas between connections facilitates vacuum pick up and automatic assembly and provides high potential insulation between connects. Additionally, in each embodiment of the present invention, the piece of bent sheet metal used to form the frame interconnect of the CPV module includes a solderable surface finish, and defines a window to accommodate an optical prism or other light guide for concentrating solar rays.

17 Claims, 5 Drawing Sheets

FRAME INTERCONNECT FOR CONCENTRATED PHOTOVOLTAIC MODULE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices, and more particularly to a robust, cost effective frame interconnect structure suitable for a concentrated photovoltaic (CPV) receiver module.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a receiver die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration. In certain existing CPV modules, the electrical connection of the receiver die to the conductive pattern is facilitated by the use of multiple wires bonded to the bus bar on the receiver die and the bond pads of the conductive pattern of the substrate, the wires being used as an alternative to the aforementioned braided ribbon or mesh interconnects. The CPV module may further include a light concentration means which is adapted to concentrate solar radiation onto the front surface of the receiver die.

Current CPV receiver die packages or modules typically generate up to ten amps of electrical current. In order to carry such high current, the above-described ribbons made of metal foil or braided wire mesh, or the above-described multiple wire bonds are used to form the interconnection between the bus bars on the top of the receiver die and the bond pads of the conductive pattern on the substrate. However, the use of the ribbon/mesh type interconnects or, alternatively, the wire bonds give rise to certain deficiencies in currently known CPV modules which detract from their overall utility. More particularly, the ribbon/mesh type interconnects do not have good shape control for automatic pick up, and require the use of specialized welding equipment for the fabrication of the CPV module using the same. Stated another way, it is often difficult to control the shape of the ribbon/mesh type interconnects for automatic pick up and placement, with the fabrication process being mostly done through the use of special welding equipment or manual soldering which is more labor intensive and thus more costly. When wire bonds are used as an alternative to the ribbon/mesh type interconnects, such wire bonds require encapsulation protection for long-term reliability of the CPV module including the same. In addition, in those CPV modules including bond wires, problems may arise in relation to current crowding if too few wires are used. As indicated above, the wires also require encapsulation, over-molding, or other protection from the environment. Moreover, the use of the soldered or welded ribbon/mesh interconnects or bond wires creates concerns regarding the electrical current carrying capability of the CPV module including the same. The present invention addresses these and other shortcomings of prior art CPV modules, as will be described in more detail below.

SUMMARY OF THE INVENTION

In accordance with the present invention, there is provided multiple embodiments of a concentrated photovoltaic (CPV) receiver package or module which includes a uniquely configured frame interconnect to facilitate the electrical connection of a receiver die of the CPV module to the conductive pattern of an underlying substrate thereof. In each embodiment of the present invention, a single piece of sheet metal is bent to form features to fit over the bus bar on the receiver die and bond pads of the conductive pattern on the substrate. Electrical connections can be made by soldering or conductive paste attach. Elevated, flat areas between connections facilitates vacuum pick up and automatic assembly and provides high potential insulation between connects. Additionally, in each embodiment of the present invention, the piece of bent sheet metal used to form the frame interconnect of the CPV module includes a solderable surface finish, and defines a window to accommodate an optical prism or other light guide for concentrating solar rays. In one embodiment of the CPV module of the present invention, the frame interconnect thereof includes extra bent features around the window opening defined thereby to help with the alignment and anchoring of the glass prism or other optical light guide, i.e., the inner edges or corners of the frame are formed to assist in the alignment and anchoring of the optical prism or other light guide. In another embodiment of the CPV module, the frame interconnect is provided with integrated, folded metal features that form an integrated cable connector. In yet another embodiment of the CPV module of the present invention, the frame interconnect has a bent metal tab on one side thereof to form an electrical interconnect to a bypass diode of the CPV module.

Advantageously, the frame interconnect of each embodiment of the CPV module provides high current carrying capacity in a solid metal sheet, and continuous contact with the bus bar of the receiver die of the CPV module with no current crowding. Moreover, encapsulation is not required during the fabrication process for the CPV module including the frame interconnect of the present invention, with the fabrication of such CPV module being compatible with standard automated assembly equipment. Further, during such the fabrication process, solder or other conductive paste attachment methods may be used as an alternative to welding, with elevated areas between connections providing high voltage potential leak prevention. As previously explained, the frame interconnect of each embodiment of the CPV module of the present invention includes integrated features for aligning a glass prism or other optical light guide, and may optionally include an integrated electrical contact to serve as an interconnect to a bypass diode, or an integrated cable connector. The frame interconnect also forms a light shield around the receiver die in each embodiment of the CPV module to protect other components from intense solar energy damage.

More particularly, in accordance with a first embodiment of the present invention, the CPV module has a frame interconnect which is made out of a single, bent metal sheet with a solderable surface finish. Flat areas included on the top surface of the frame interconnect facilitate pick up in an automated assembly process. The frame interconnect also includes contact areas for soldering or other methods of attachment for electrical conduction and mechanical strength. Additionally, in the frame interconnect included in the CPV module of the first embodiment, the window defined by the frame interconnect includes inner edges which are adapted to align and anchor a glass prism or other light guide to the receiver die of the CPV module.

In accordance with a second embodiment of the present invention, the CPV module includes a frame interconnect similar to that described above in relation to the first embodiment, but having electrical contacts with straight edges instead of flanged edges to increase placement accuracy. The frame interconnect of the CPV module of the second embodiment also includes added upwardly bent tabs to increase the rigidity of the structure.

In accordance with a third embodiment of the present invention, the CPV module includes a frame interconnect similar to that described in relation to the second embodiment, but wherein the inner edges defining the window of the frame interconnect have chamfered corners such that only point contacts are defined with the glass prism/light guide to reduce optical coupling loss and scratching on the optical surface thereof.

In accordance with a fourth embodiment of the present invention, the CPV module includes a frame interconnect similar to that described in relation to the second embodiment, but wherein the frame interconnect further includes an added folded cable connector on one side thereof to capture the exposed end of an insulated cable which forms an electrical connection with the CPV module. The added folded cable connector in the frame interconnect of the CPV module of the fourth embodiment eliminates the need for a separate connector or a directly welded or soldered cable.

Finally, in accordance with a fifth embodiment of the present invention, the CPV module includes a frame interconnect similar to that described in relation to the second embodiment, but wherein the frame interconnect has one section of an upward tab shaped and bent downward to form electrical contact with a bypass diode mounted on the substrate of the CPV module. The inclusion of the bent contact in the frame interconnect included in the CPV module of the fifth embodiment eliminates the need to multiple wire bond and encapsulate the bypass diode in a separate procedure. The bent metal sheet also provides better current carrying capability and reliability against harsh environments.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
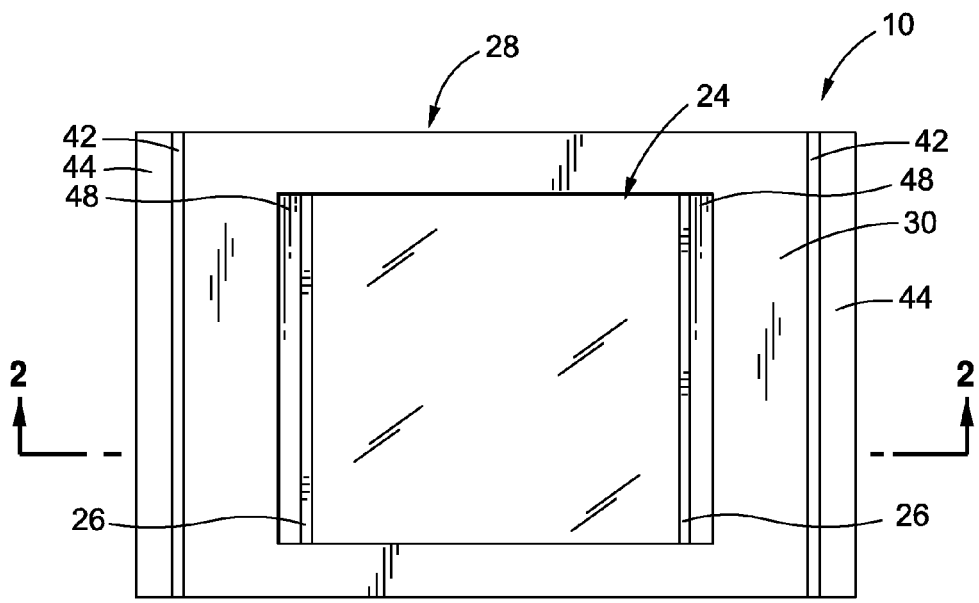
FIG. 1 is a top plan view of a CPV module constructed in accordance with a first embodiment of the present invention.
Figure 2:
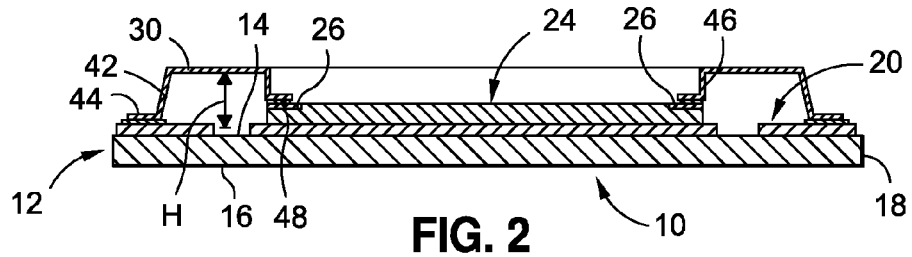
FIG. 2 is a cross-sectional view taken along line 2-2 of FIG. 1.
Figure 3:
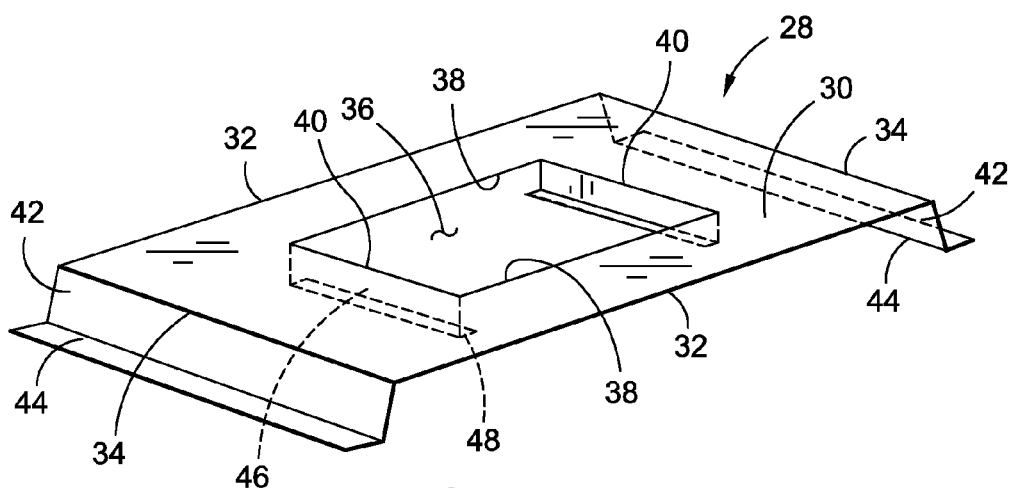
FIG. 3 is a top perspective view of the frame interconnect of the CPV module shown in FIGS. 1 and 2.

Referring now to the drawings wherein the showings are for purposes of illustrating preferred embodiments of the present invention only, and not for purposes of limiting the same, FIGS. 1-3 depict a CPV module 10 constructed in accordance with a first embodiment of the present invention. The module 10 comprises a substrate 12 which has a generally quadrangular (e.g., rectangular, square) configuration. When viewed from the perspective shown in FIG. 2, the substrate 12 defines a generally planar top surface 14, and an opposed, generally planar bottom surface 16. Extending generally perpendicularly between the top and bottom surfaces 14, 16 is a peripheral side surface 18 of the substrate 12. Disposed on the top surface 14 of the substrate 12 is an electrically conductive pattern 20 which may be formed in any one of a multiplicity of different configurations or arrangements on the top surface 14.

The module 10 constructed in accordance with the present invention further comprises a receiver die 24, the back or bottom surface of which, when viewed from the perspective shown in FIG. 2, is mounted and electrically connected to a prescribed portion of the conductive pattern 20 of the substrate 12. The receiver die 24 has a generally quadrangular (e.g., square) configuration, and includes two contact strips or bus bars 26 disposed on the front or top surface thereof. As seen in FIGS. 1 and 2, the bus bars 26 extend in spaced, generally parallel relation to each other along respective ones of an opposed pair of side edges of the receiver die 24. Though not shown in FIGS. 1 and 2, it is further contemplated that the module 10 may include an electronic device such as a packaged diode or a rectifier die which is mounted and electrically connected to a prescribed portion of the conductive pattern 20 of the substrate 12.

In addition to the substrate 12 and receiver die 24, the module 10 constructed in accordance with the first embodiment of the present invention includes a frame interconnect 28 which is shown individually in FIG. 3. As will be described in more detail below, the frame interconnect 28 facilitates the electrical connection of the bus bars 26 of the receiver die 24 to prescribed portions of the conductive pattern 20 of the substrate 12. In the module 10, the frame interconnect 28 is fabricated from a single metal sheet with a solderable finish which is bent to define various structural features. In particular, the frame interconnect 28 is formed to define a generally planar main body portion 30 which has a generally quadrangular configuration. As shown in FIGS. 1-3, the main body portion 30 has a generally rectangular configuration defining an opposed, generally parallel pair of outer longitudinal sides 32, and an opposed, generally parallel pair of outer lateral sides 34. Though the main body portion 30 is shown in FIGS. 1-3 as having a rectangular configuration, those of ordinary skill in the art will recognize that the main body portion 30 may alternatively be provided in a generally square configuration without departing from the spirit and scope of the present invention.

The frame interconnect 28 of the module 10 includes a window 36 which is disposed in the approximate center of the main body portion 30 thereof. Like the main body portion 30, the window 36 has a generally rectangular configuration, and is collectively defined by an opposed, generally parallel pair of inner longitudinal sides 38 and an opposed, generally parallel pair of inner lateral sides 40 of the main body portion 30. Though the window 36 is shown in FIG. 3 as having a generally rectangular configuration, those of ordinary skill in the art will recognize that the window 36 may alternatively be formed to have a generally square configuration without departing from the spirit and scope of the present invention.

In addition to the main body portion 30, the frame interconnect 28 includes an opposed pair of generally planar, rectangularly configured outer contact portions 42 which are integrally connected to and extend along the lengths of respective ones of the outer lateral sides 34 of the main body portion 30. When viewed from the perspective shown in FIGS. 2 and 3, the outer contact portions 42 extend downwardly from respective ones of the outer lateral sides 34 at a slight outward angle, i.e., each of the outer contact portions 42 is flared slightly outwardly relative to the main body portion 30.

As seen in FIGS. 1-3, the frame interconnect 28 further includes an opposed pair of generally planar, rectangularly configured outer flange portions 44 which are integrally connected to and extend along the lengths of respective ones of the outer contact portions 42. More particularly, when viewed from the perspective shown in FIGS. 2 and 3, each outer flange portion 44 extends outwardly from that side of a respective one of the outer contact portions 42 which is opposite the side extending along and integrally connected to a respective one of the outer lateral sides 34 of the main body portion 30. In the frame interconnect 28, the main body portion 30 resides on a first plane, with the outer flange portions 44 residing on a common second plane which extends in spaced, generally parallel relation to the first plane.

The frame interconnect 28 of the module 10 further includes an opposed pair of generally planar, rectangularly configured inner contact portions 46 which are integrally connected to and extend along the lengths of respective ones of the inner lateral sides 40 of the main body portion 30. When viewed from the perspective shown in FIGS. 2 and 3, the inner contact portions 46 extend generally perpendicularly downward from respective ones of the inner lateral sides 40. Though the inner contact portions 46 are shown in FIGS. 2 and 3 as an opposed pair, those of ordinary skill in the art will recognize that the frame interconnect 28 may be fabricated to include only one inner contact portion 46 extending along any inner lateral side 40 or any inner longitudinal side 38 in the event that the receiver die 24 includes only a single, corresponding bus bar 26. Further, if two inner contact portions 46 are included, the frame interconnect 28 may be alternatively configured such that the inner contact portions 46 extend along respective ones of the inner longitudinal and/or inner lateral sides 38, 40 in any combination, it being contemplated that the particular combination will correspond to the arrangement of the bus bars 26 of the receiver die 24.

As further seen in FIGS. 1-3, the frame interconnect 28 also includes an opposed pair of generally planar, rectangularly configured inner flange portions 48 which are integrally connected to and extend along the lengths of respective ones of the inner contact portions 46. More particularly, when viewed from the perspective shown in FIGS. 2 and 3, each inner flange portion 48 extends inwardly from that side of a respective one of the inner contact portions 46 which is opposite the side extending along and integrally connected to a respective one of the inner lateral sides 40 of the main body portion 30. As indicated above, in the frame interconnect 28, the main body portion 30 resides on a first plane, with the outer flange portions 44 residing on a common second plane which extends in spaced, generally parallel relation to the first plane. The inner flange portions 48 reside on a common third plane which extends between and in generally parallel relation to the first and second planes.

As indicated above, the frame interconnect 28 is used to facilitate the electrical connection of the bus bars 26 of the receiver die 24 to prescribed portions of the conductive pattern 20 of the substrate 12. More particularly, as seen in FIGS. 1 and 2, such electrical connection is facilitated by the mounting and electrically connecting the inner flange portions 48 of the frame interconnect 28 to respective ones of the bus bars 26 of the receiver die 24. As best seen in FIG. 1, the frame interconnect 28 is sized and oriented relative to the receiver die 24 such that the lengths of the inner flange portions 48 are roughly equal to the lengths of the bus bars 26, with each inner flange portion 48 thus extending along the entire length of the corresponding bus bar 26 when mounted and electrically connected thereto. The mounting and electrical connection of each inner flange portion 48 to a respective one of the bus bars 26 is preferably facilitated through the use of solder or a suitable conductive paste.

As best seen in FIG. 2, the shape of the frame interconnect 28 allows for the mounting and electrical connection of the outer flange portions 44 to corresponding prescribed portions of the conductive pattern 20 of the substrate 12 when the inner flange portions 48 are mounted and electrically connected to respective ones of the bus bars 26 in the above-described manner. The mounting and electrical connection of the outer flange portions 44 to respective prescribed portions of the conductive pattern 20 is also preferably facilitated through the use of solder or a suitable conductive paste. As is further seen in FIG. 2, when the frame interconnect 28 is mounted and electrically connected to both the receiver die 24 and the conductive pattern 20 of the substrate 12 in the aforementioned manner, the main body portion 30 is raised or elevated by a prescribed height H above the top surface 14 of the substrate 12. Such elevation of the main body portion 30 relative to the substrate 12 prevents high voltage shorting between the main body portion 30 of the frame interconnect 28 and that portion of the conductive pattern 20 which resides below the main body portion 30 and to which the receiver die 24 is electrically connected. In this regard, the portion of the conductive pattern 20 to which the receiver die 24 is electrically connected may be of an opposite polarity to that portion of the conductive pattern 20 to which the outer flange portions 44 of the frame interconnect 28 are electrically connected, thus creating the aforementioned shorting risk which is alleviated by the elevation of the main body portion 30 above the top surface 14 of the substrate 12 by the height H.

As explained above, the frame interconnect 28 of the module 10 is made of a single, bent metal sheet with a solderable surface finish. The flat area defined by the top surface of the main body portion 30 when viewed from the perspective shown in FIG. 2 facilitates pick up in an automated assembly process. The outer and inner flange portions 44, 48 of the frame interconnect 28 provide contact areas for soldering or other methods of attachment to the receiver die 24 and conductive pattern 20 of the substrate 12. Further, the window 36 defined by the frame interconnect 28, and in particular the inner longitudinal and lateral sides 38, 40 of the main body portion 30 defining the window 36, are adapted to align and anchor a glass prism or other light guide to the receiver die 24 of the module 10. As will be recognized, such light guide is adapted to facilitate the concentration of solar energy or rays onto the front or top surface of the receiver die 24.

Figure 4:
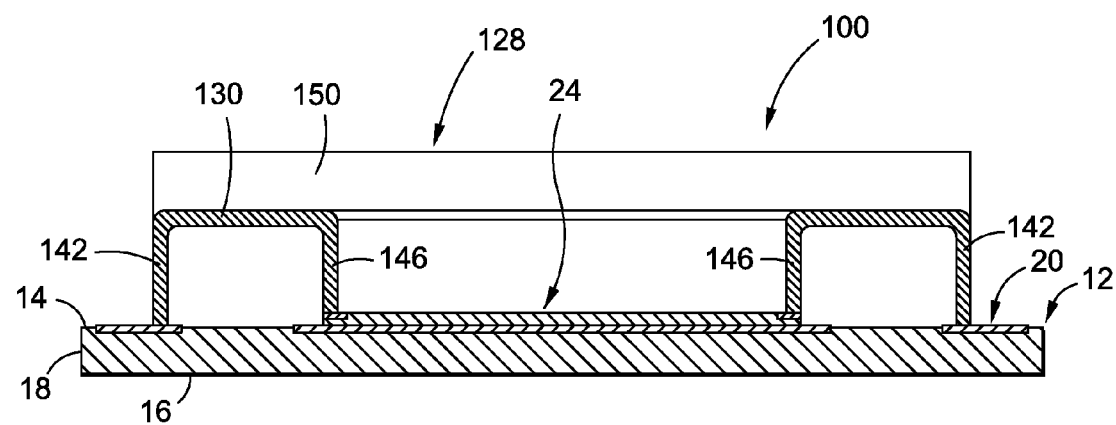
FIG. 4 is a cross-sectional view of a CPV module constructed in accordance with a second embodiment of the present invention.

Referring now to FIG. 4, there is shown in cross-section a CPV module 100 constructed in accordance with a second embodiment of the present invention. The module 100 is similar in structure to the above-described module 10, with only the distinctions between the modules 100, 10 being described below.

Figure 5:
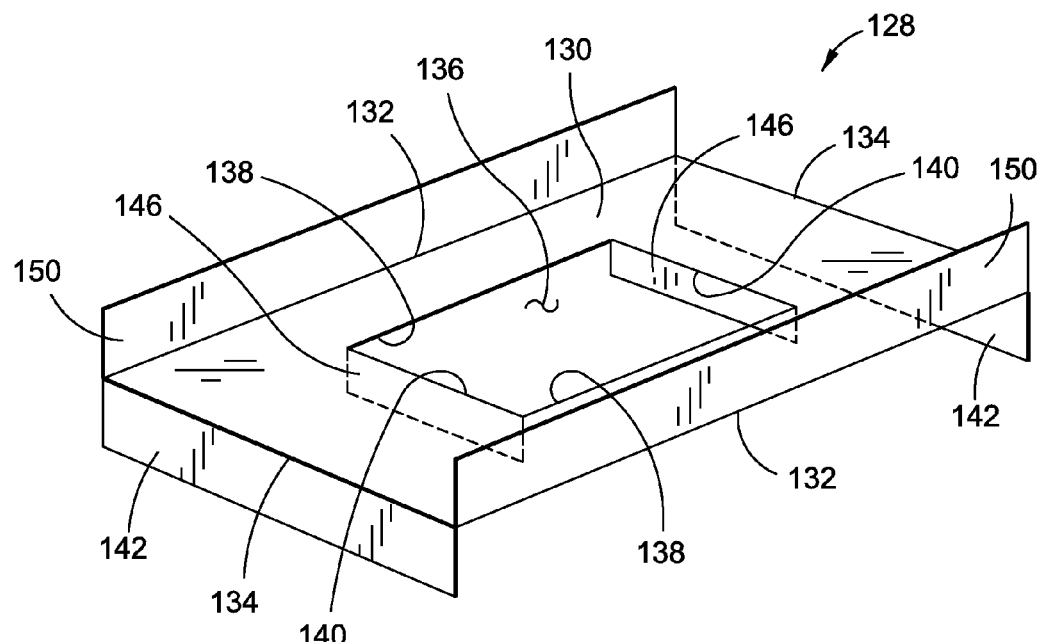
FIG. 5 is a top perspective view of the frame interconnect of the CPV module shown in FIG. 4.

The sole distinction between the CPV modules 100, 10 lies in the structural attributes of the frame interconnect 128 included in the module 100, in comparison to the frame interconnect 28 of the module 10. In the module 100, the frame interconnect 128 is fabricated from a single metal sheet with a solderable finish which is bent to define various structural features. In particular, the frame interconnect 128 is formed to define a generally planar main body portion 130 which has a generally quadrangular configuration. As shown in FIGS. 4 and 5, the main body portion 130 has a generally rectangular configuration defining an opposed, generally parallel pair of outer longitudinal sides 132, and an opposed, generally parallel pair of outer lateral sides 134. Though the main body portion 130 is shown in FIG. 5 as having a rectangular configuration, those of ordinary skill in the art will recognize that the main body portion 130 may alternatively be provided in a generally square configuration without departing from the spirit and scope of the present invention.

The frame interconnect 128 of the module 100 includes a window 136 which is disposed in the approximate center of the main body portion 130 thereof. Like the main body portion 130, the window 136 has a generally rectangular configuration, and is collectively defined by an opposed, generally parallel pair of inner longitudinal sides 138 and an opposed, generally parallel pair of inner lateral sides 140 of the main body portion 130. Though the window 136 is shown in FIG. 5 as having a generally rectangular configuration, those of ordinary skill in the art will recognize that the window 136 may alternatively be formed to have a generally square configuration without departing from the spirit and scope of the present invention.

In addition to the main body portion 130, the frame interconnect 128 includes an opposed pair of generally planar, rectangularly configured outer contact portions 142 which are integrally connected to and extend along the lengths of respective ones of the outer lateral sides 134 of the main body portion 130. When viewed from the perspective shown in FIGS. 4 and 5, the outer contact portions 142 extend generally perpendicularly downward from respective ones of the outer lateral sides 134. The frame interconnect 128 of the module 100 further includes an opposed pair of generally planar, rectangularly configured inner contact portions 146 which are integrally connected to and extend along the lengths of respective ones of the inner lateral sides 140 of the main body portion 130. When viewed from the perspective shown in FIGS. 4 and 5, the inner contact portions 146 extend generally perpendicularly downward from respective ones of the inner lateral sides 140. In the frame interconnect 128, the heights of the identically configured inner contact portions 146 are slightly less than those of the identically configured outer contact portions 142 when viewed from the perspective shown in FIG. 4. As a result, the distal edges defined by the inner contact portions 146 are slightly elevated above the distal edges defined by the outer contact portions 142.

As further seen in FIGS. 4 and 5, the frame interconnect 128 also includes an opposed pair of generally planar, rectangularly configured tab portions 150 which are integrally connected to and extend along the lengths of respective ones of the outer longitudinal sides 132 of the main body portion 130. More particularly, when viewed from the perspective shown in FIGS. 4 and 5, each tab portion 150 extends generally perpendicularly upward relative to the main body portion 130 from a respective one of the outer longitudinal sides 132 defined thereby.

In the module 100, the frame interconnect 128 is used to facilitate the electrical connection of the bus bars 26 of the receiver die 24 to prescribed portions of the conductive pattern 20 of the substrate 12. More particularly, as seen in FIG. 4, such electrical connection is facilitated by the mounting and electrically connecting the inner contact portions 146 of the frame interconnect 128 to respective ones of the bus bars 26 of the receiver die 24. The frame interconnect 128 is preferably sized and oriented relative to the receiver die 24 such that the lengths of the inner contact portions 146 are roughly equal to the lengths of the bus bars 26, with each inner contact portion 146 thus extending along the entire length of the corresponding bus bar 26 when mounted and electrically connected thereto. The mounting and electrical connection of each inner contact portion 146 to a respective one of the bus bars 26 is preferably facilitated through the use of solder or a suitable conductive paste.

As best seen in FIG. 4, the shape of the frame interconnect 128 allows for the mounting and electrical connection of the outer contact portions 142 to corresponding prescribed portions of the conductive pattern 20 of the substrate 12 when the inner contact portions 142 are mounted and electrically connected to respective ones of the bus bars 26 in the above-described manner. The mounting and electrical connection of the outer contact portions 142 to respective prescribed portions of the conductive pattern 20 is also preferably facilitated through the use of solder or a suitable conductive paste. As will be recognized, the height differential between the inner contact portions 146 and the outer contact portions 142 in the frame interconnect 128 is roughly equal to the height or thickness of the receiver die 24.

The frame interconnect 128 of the module 100 is made of a single, bent metal sheet with a solderable surface finish. The flat area defined by the top surface of the main body portion 130 when viewed from the perspective shown in FIG. 4 facilitates pick up in an automated assembly process. The outer and inner contact portions 142, 146 of the frame interconnect 128 provide contact areas for soldering or other methods of attachment to the receiver die 24 and conductive pattern 20 of the substrate 12. Further, the window 136 defined by the frame interconnect 128, and in particular the inner longitudinal and lateral sides 138, 140 of the main body portion 130 defining the window 136, are adapted to align and anchor a glass prism or other light guide to the receiver die 24 of the module 100. The inclusion of the tab portions 150 in the frame interconnect 128 add structural rigidity thereto. Additionally, the straight distal edges defined by the outer and inner contact portions 142, 146 (due to the absence of structures like the above-described outer and inner flange portions 44, 48) increases placement accuracy when the frame interconnect 128 is mated to the bus bars 26 of the receiver die 24 and the conductive pattern 20 of the substrate 12.

Figure 6:
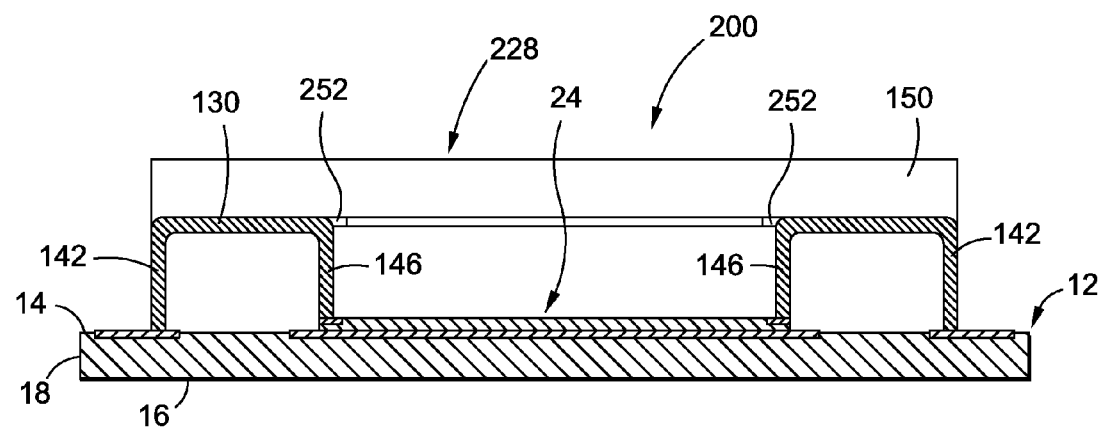
FIG. 6 is a cross-sectional view of a CPV module constructed in accordance with a third embodiment of the present invention.
Figure 7:
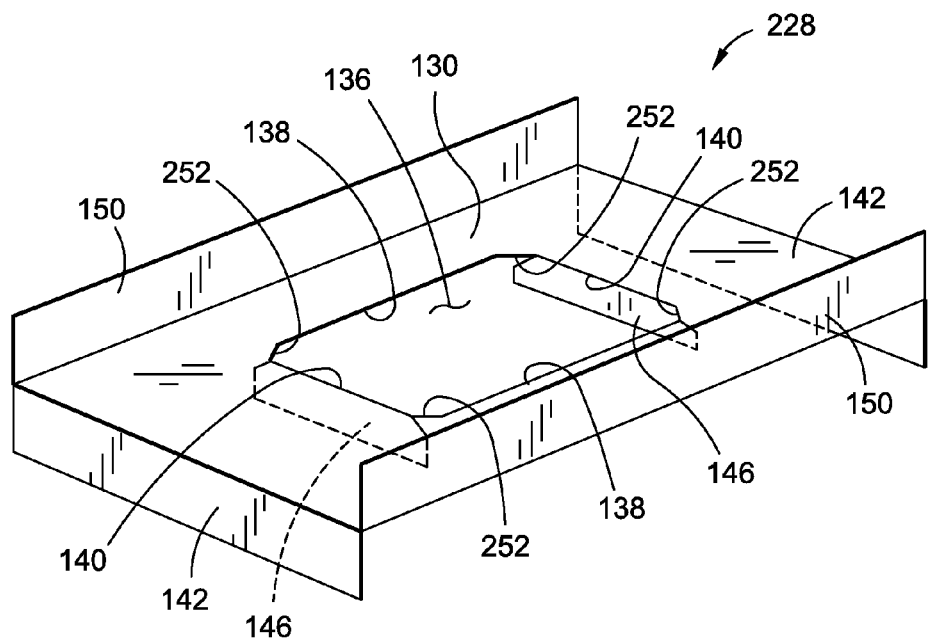
FIG. 7 is a top perspective view of the frame interconnect of the CPV module shown in FIG. 6.

Referring now to FIG. 6, there is shown in cross-section a CPV module 200 constructed in accordance with a third embodiment of the present invention. The module 200 is substantially similar in structure to the above-described module 100, with the sole distinction between the CPV modules 200, 100 lying in the inclusion of a slight structural modification in the frame interconnect 228 included in the module 200, in comparison to the frame interconnect 128 of the module 100. In this regard, only the structural differences between the frame interconnects 228, 128 will be described below. The frame interconnect 228 is shown in FIG. 7 separate from the module 200.

More particularly, in the frame interconnect 228, each adjacent pair of inner longitudinal and lateral sides 138, 140 is separated from each other by a chamfered corner 252. Thus, in the frame interconnect 228 included in the module 200, the window 136 thereof is collectively defined by the inner longitudinal and lateral sides 138, 140 and chamfered corners 252 of the main body portion 130. As described above in relation to the CPV module 100, the window 136 defined by the frame interconnect 128, and in particular the inner longitudinal and lateral sides 138, 140 of the main body portion 130 defining the window 136, are adapted to align and anchor a glass prism or other light guide to the receiver die 24. In the frame interconnect 228 included in the module 200, only point contacts are created between the frame interconnect 228 and the glass prism/light guide, such point contacts being defined between the glass prism/light guide and each of the four chamfered corners 252. The point contacts defined between the chamfered corners 252 and the glass prism/light guide effectively reduce optical coupling loss and scratching on the optical surface of the glass prism/light guide when the same is partially advanced through the window 136 of the frame interconnect 228.

Figure 8:
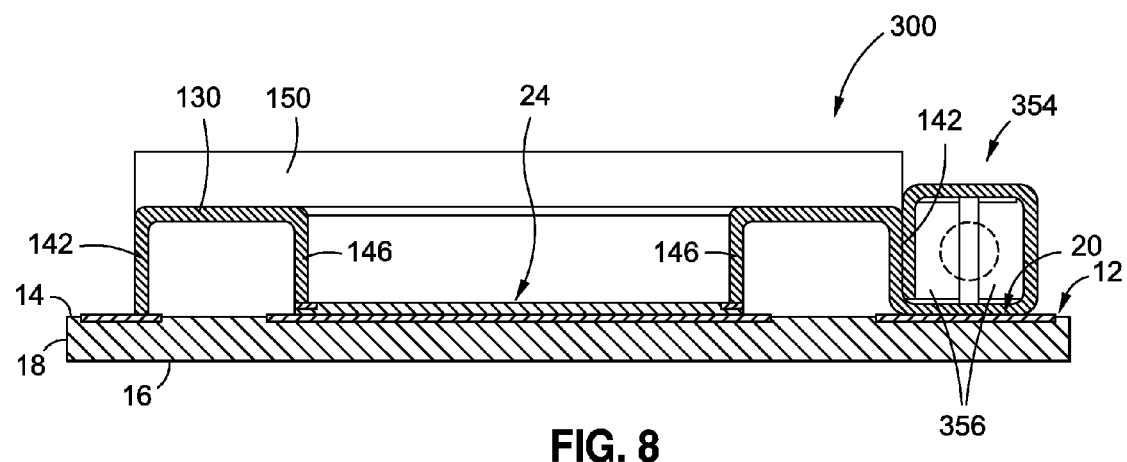
FIG. 8 is a cross-sectional view of a CPV module constructed in accordance with a fourth embodiment of the present invention.
Figure 9:
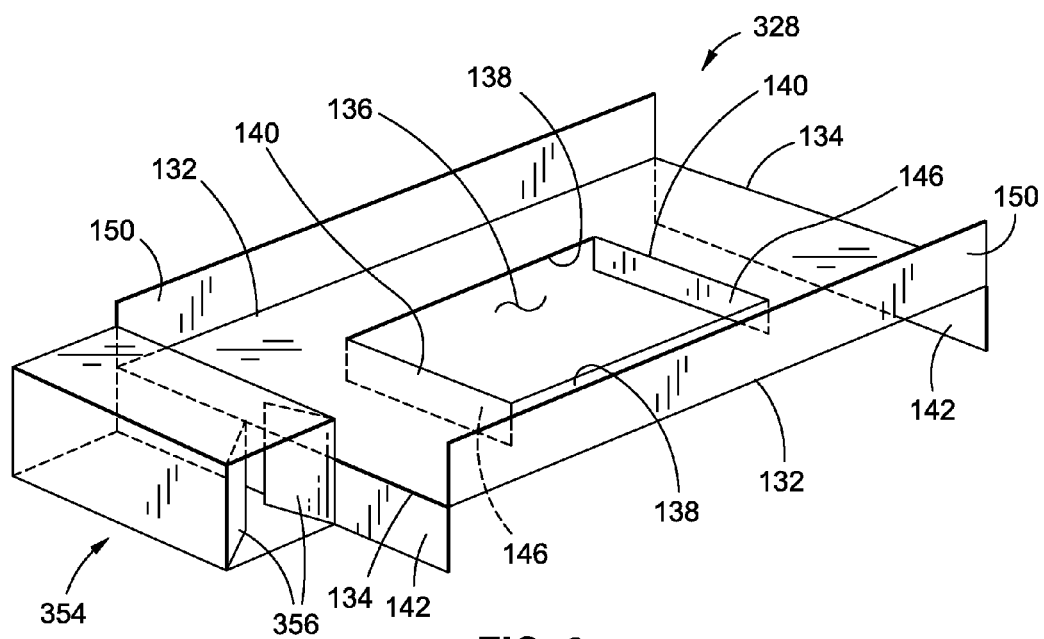
FIG. 9 is a top perspective view of the frame interconnect of the CPV module shown in FIG. 8.

Referring now to FIG. 8, there is shown in cross-section a CPV module 300 constructed in accordance with a fourth embodiment of the present invention. The module 300 is similar in structure to the above-described module 100, with the sole distinction between the CPV modules 300, 100 lying in the inclusion of a structural modification in the frame interconnect 328 included in the module 300, in comparison to the frame interconnect 128 of the module 100. In this regard, only the structural differences between the frame interconnects 328, 128 will be described below. The frame interconnect 328 is shown in FIG. 9 separate from the module 300.

More particularly, the frame interconnect 328 includes a cable connector portion 354 which is integrally connected to one of the outer contact portions 142 thereof. As best seen in FIG. 8, the cable connector portion 354 is integrally connected to and extends along a portion of the distal edge of one of the outer contact portions 142. Though, as shown in FIG. 9, the length of the cable connector portion 354 is less than that of the outer contact portion 142 to which it is integrally connected, those of ordinary skill in the art will recognize that the cable connector portion 354 may alternatively be sized to have a length which is equal to or exceeds that of the corresponding outer contact portion 142. Further, the cable connector portion 354 is preferably formed such that the height thereof, when viewed from the perspective shown in FIGS. 8 and 9, exceeds that of the corresponding outer contact portion 142. However, those of ordinary skill in the art will recognize that the height of the cable connector portion 354 may alternatively be substantially equal to or less than that of the corresponding outer contact portion 142. As best seen in FIG. 8, the cable connector portion 354 is preferably formed to have a tubular, generally square cross-sectional configuration, with one of the four walls defining the same preferably being disposed in abutting contact with the outer contact portion 142 to which the cable connector portion 354 is integrally connected.

In the module 300, the cable connector portion 354 of the frame interconnect 328 is adapted to capture the exposed end of an insulated cable (shown in phantom in FIG. 8) to facilitate the electrical connection of such insulated cable to the conductive pattern 20 of the substrate 12. Along these lines, the bottom wall of the cable connector portion 354, when viewed from the perspective shown in FIG. 8, is mounted and electrically connected to a prescribed portion of the conductive pattern 20, thus facilitating the electrical connection of the insulated cable to the conductive pattern 20 when such insulated cable is advanced into the hollow interior of the cable connector portion 354. As is also apparent from FIGS. 8 and 9, the cable connector portion 354 is preferably outfitted with an integral pair of retention tabs 356 which are adapted to assist in maintaining the insulated cable within the hollow interior of the cable connector portion 354.

Figure 10:
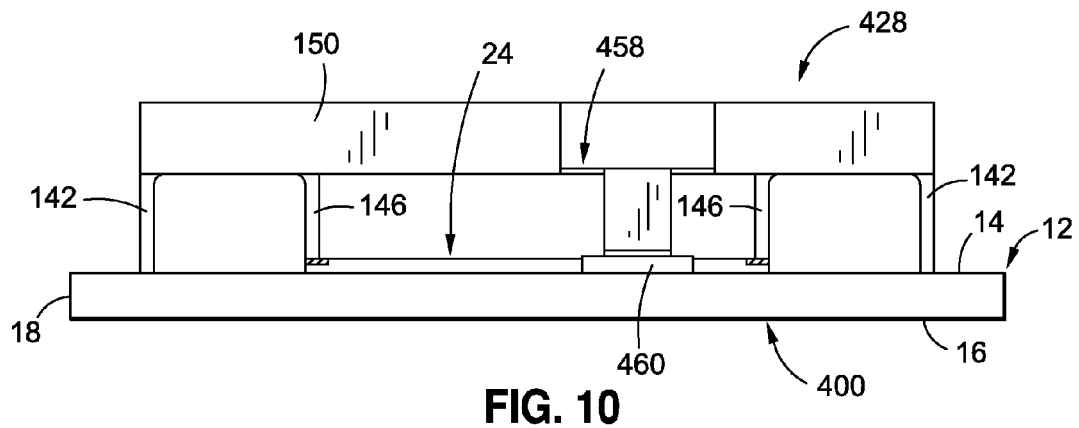
FIG. 10 is a front-elevational view of a CPV module constructed in accordance with a fifth embodiment of the present invention.
Figure 11:
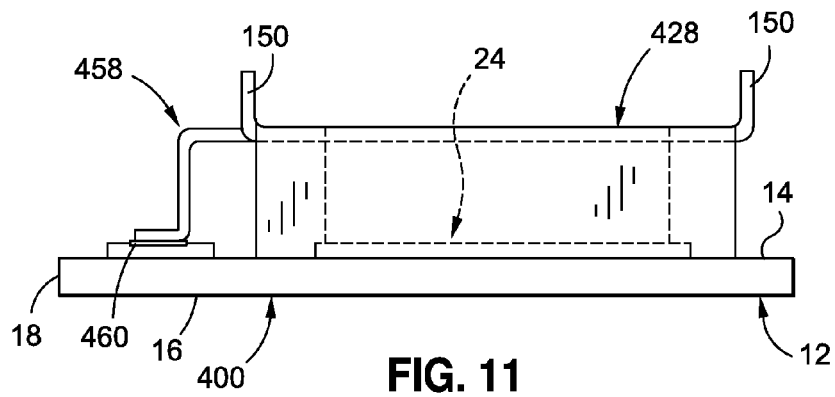
FIG. 11 is a side-elevational view of the CPV module constructed in accordance with the fifth embodiment of the present invention.

Referring now to FIGS. 10 and 11, there is provided front and side elevational views of a CPV module 400 constructed in accordance with a fifth embodiment of the present invention. The module 400 is similar in structure to the above-described module 100, with the sole distinction between the CPV modules 400, 100 lying in the inclusion of a structural modification in the frame interconnect 428 included in the module 400, in comparison to the frame interconnect 128 of the module 100. In this regard, only the structural differences between the frame interconnects 428, 128 will be described below. The frame interconnect 428 is shown in FIG. 12 separate from the module 400.

Figure 12:
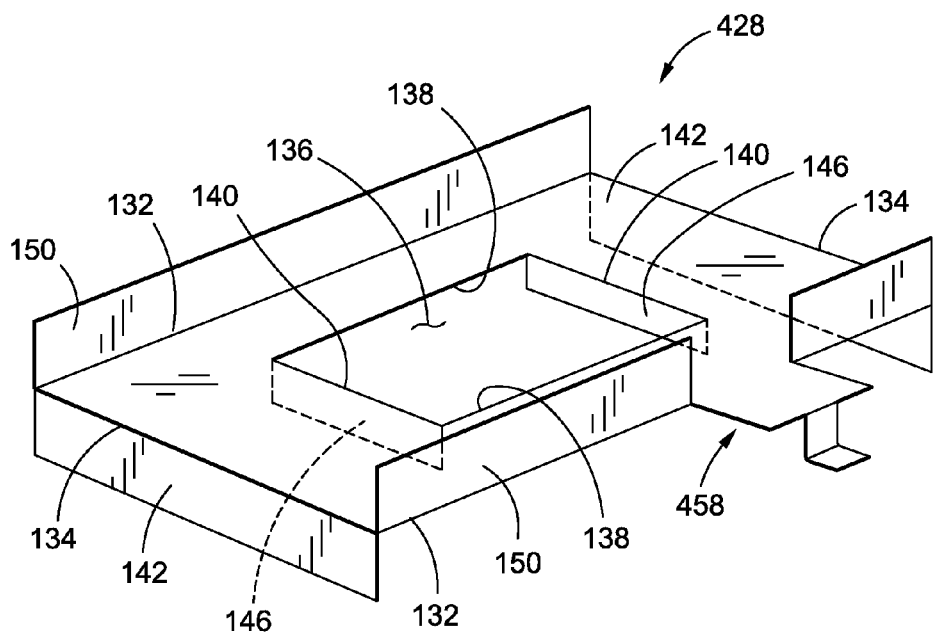
FIG. 12 is a top perspective view of the frame interconnect of the CPV module shown in FIGS. 10 and 11.

More particularly, in the frame interconnect 428, a section of one of the tab portions 150 is bent downwardly when viewed from the perspective shown in FIGS. 10 and 12 and shaped to define a supplemental contact portion 458 of the frame interconnect 428. The supplemental contact portion 458 is specifically sized and configured to facilitate the electrical connection of the frame interconnect 428 to an electrical component such as a bypass diode 460 which is mounted and electrically connected to a prescribed portion of the conductive pattern 20 of the substrate 12. Thus, in addition to being electrically connected to the bus bars 26 of the receiver die 24 and to prescribed portions of the conductive pattern 20 through the use of the outer and inner contact portions 142, 146, the frame interconnect 428 of the module 400 may be simultaneously electrically connected to the bypass diode 460 through the use of the supplemental contact 458 thereof. As is most easily seen in FIG. 12, the distal edge of the tab portion 150 modified to include the supplemental contact portion 458 is not continuous, but rather is interrupted as a result of the formation of the supplemental contact portion 458 therein. Additionally, in the frame interconnect 428, the topmost section of the supplemental contact portion 458 when viewed from the perspective shown in FIG. 12 is preferably substantially flush or continuous with the main body portion 130 of the frame interconnect 428. Advantageously, when the bypass diode 460 is included in the module 400, the inclusion of the supplemental contact portion 458 in the frame interconnect 428 eliminates the need to wire bond and encapsulate such bypass diode 460.

Those of ordinary skill in the art will recognize that a structure such as the supplemental contact portion 458 may optionally be added to the above-described frame interconnects 128, 228, 328. Additionally, structural features like the chamfered corners 252 of the frame interconnect 228 may be added to the frame interconnects 328, 428 without departing from the spirit and scope of the present invention. Further, although the frame interconnect 428 is shown and described above as including only one supplemental contact portion 458, one or more additional supplemental contact portions 458 may be formed in either or both of the tab portions 150. Along these lines, in the frame interconnect 428, the supplemental contact portion 458 can be located anywhere within the corresponding tab portion 150, and not necessarily solely in the location shown in FIGS. 10 and 12.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A concentrated photovoltaic (CPV) module, comprising:
    a substrate having a conductive pattern disposed thereon;
    a receiver die having a top surface including a pair of bus bars disposed on the top surface thereof, and an opposed bottom surface mounted to and electrically connected to a prescribed portion of the conductive pattern; and
    a frame interconnect comprising a single piece of material and including:
    a main body portion disposed above the receiver die and including a window formed therein and in which a portion of the receiver die is exposed;
    a pair of inner contact portions extending generally downward from the main body portion toward the receiver die and directly attached to respective ones of the bus bars of the receiver die; and
    a pair of outer contact portions extending generally downward from the main body portion toward the substrate, wherein the pair of outer contact portions are directly attached to respective prescribed portions of the conductive pattern of the substrate.

2. The CPV module of claim 1 wherein the window is sized and configured to facilitate the alignment of a light concentrating device with the portion of the receiver die exposed in the window, and wherein the frame interconnect comprises sheet metal.

3. The CPV module of claim 2 wherein the window is partially defined by a plurality of chamfered corners of the frame interconnect, the chamfered corners being sized and configured to define point contacts with the light concentrating device upon the advancement thereof through the window.

4. The CPV module of claim 2 wherein the frame interconnect further includes an integral cable connector portion.

5. The CPV module of claim 2 wherein:
    a bypass diode is mounted and electrically connected to a prescribed portion of the conductive pattern; and
    the frame interconnect is further sized and configured to facilitate the electrical connection of at least one of the bus bars of the receiver die to the bypass diode.

6. The CPV module of claim 1 wherein the main body of the frame interconnect includes a plurality of inner sides which are arranged in opposed pairs and collectively define the window in a generally quadrangular configuration.

7. The CPV module of claim 6 wherein the window is partially defined by a plurality of chamfered corners which are defined by the main body portion and extend between respective adjacent pairs of the inner sides, the chamfered corners being sized and configured to define point contacts with the light concentrating device upon the advancement thereof through the window.

8. The CPV module of claim 6 wherein the inner contact portions extend along respective ones of an opposed pair of the inner sides of the main body portion of the frame interconnect.

9. The CPV module of claim 1, wherein each of the inner contact portions comprise an inner flange portion directly attached to a respective bus bar of the receiver die; and wherein each of the outer contact portions comprise an outer flange portion directly attached to a respective prescribed portion of the conductive pattern of the substrate.

10. The CPV module of claim 9 wherein:
    the main body portion has a generally planar configuration and extends along a first plane; and
    each outer flange portion has a generally planar configuration and extends along a common second plane which is disposed in spaced, generally parallel relation to the first plane; and
    each inner flange portion has a generally planar configuration and extends along a common third plane which is disposed between and in generally parallel relation to the first and second planes.

11. The CPV module of claim 10 wherein:
    the inner contact portions each extend generally perpendicularly relative to the main body portion; and
    the outer contact portions each extend at an outward angle relative to the main body portion.

12. The CPV module of claim 1 wherein the main body portion is generally planar, and the inner and outer contact portions are each generally planar and extend generally perpendicularly relative to the main body portion.

13. The CPV module of claim 12 wherein:
    the receiver die has a prescribed thickness;
    the inner contact portions are each of a first height; and
    the outer contact portions are each of a second height which exceeds the first height by a distance substantially equal to the thickness of the receiver die.

14. The CPV module of claim 1 wherein the frame interconnect further includes a pair of tab portions integrally connected to the main body portion, the tab portions being sized and configured to increase the structural integrity of the frame interconnect.

15. The CPV module of claim 14 wherein:
    a bypass diode is mounted and electrically connected to a prescribed portion of the conductive pattern; and
    one of the tab portions includes a supplemental contact portion protruding therefrom which is sized and configured to facilitate the electrical connection of at least one of the bus bars of the receiver die to the bypass diode.

16. The CPV module of claim 1 wherein the frame interconnect further includes an cable connector portion which is integrally connected to and extends at least partially along one of the outer contact portions.

17. A concentrated photovoltaic (CPV) module, comprising:
- a substrate having a conductive pattern;
- a receiver die having a bottom surface mounted to the substrate, wherein the receiver die includes at least a pair of bus bars disposed on a top surface thereof; and
- a frame interconnect that comprises a single piece of material and sized and configured to provide direct electrical connection of the receiver die to at least two prescribed portions of the substrate, wherein the frame interconnect includes:
  - a main body portion including a window formed therein and in which a portion of the receiver die is exposed, the window being sized and configured to facilitate the alignment of a light concentrating device with the portion of the receiver die exposed in the window;
  - a pair of inner contact portions extending generally downward from the main body portion and directly attached to respective ones of the bus bars disposed on the receiver die; and
  - a pair of outer contact portions extending generally downward from the main body portion and directly attached to respective prescribed portions of the conductive pattern of the substrate.

* * * * *